United States Patent [19]

Widmann

[11] 4,356,622

[45] Nov. 2, 1982

[54] METHOD OF PRODUCING LOW-RESISTANCE DIFFUSED REGIONS IN IC MOS SEMICONDUCTOR CIRCUITS IN SILICON-GATE TECHNOLOGY METAL SILICIDE LAYER FORMATION

[75] Inventor: Dietrich Widmann, Unterhaching, Fed. Rep. of Germany

[73] Assignee: Siemens Aktiengesellschaft, Berlin & Munich, Fed. Rep. of Germany

[21] Appl. No.: 157,495

[22] Filed: Jun. 9, 1980

[30] Foreign Application Priority Data

Jul. 3, 1979 [DE] Fed. Rep. of Germany ....... 2926874

[51] Int. Cl.³ .................. H01L 21/225; H01L 21/283
[52] U.S. Cl. ........................................ 29/571; 29/578; 29/590; 29/591; 148/174; 148/188; 357/23; 357/59; 357/67; 357/71; 427/88; 427/91
[58] Field of Search ................. 29/571, 578, 590, 591; 427/84, 88, 89, 91; 148/188, 174; 357/23, 59, 67, 71

[56] References Cited

U.S. PATENT DOCUMENTS

| | | | |
|---|---|---|---|
| 3,574,010 | 4/1971 | Brown | 29/571 X |
| 3,600,235 | 8/1971 | Okumura | 29/571 X |
| 3,667,008 | 5/1972 | Katnack | 357/71 |
| 3,887,993 | 6/1975 | Okada et al. | 29/578 X |
| 3,918,149 | 11/1975 | Roberts | 427/88 X |
| 3,942,241 | 3/1976 | Harigaya et al. | 29/571 |
| 4,063,901 | 12/1977 | Shiba | 29/578 |
| 4,069,067 | 1/1978 | Ichinobe | 148/188 |
| 4,151,631 | 5/1979 | Klein | 29/578 X |

*Primary Examiner*—L. Dewayne Rutledge
*Assistant Examiner*—W. G. Saba
*Attorney, Agent, or Firm*—Hill, Van Santen, Steadman, Chiara & Simpson

[57] ABSTRACT

Low-resistance diffused regions useful as current-supply paths in IC MOS semiconductor circuits in silicon-gate technology are produced by forming a metal silicide on a doped polysilicon layer positioned on a substrate, applying a $SiO_2$ layer over the silicide layer, structuring the resultant $SiO_2$-silicide-polysilicon triple layer in such a manner that areas of the substrate where the low resistance diffused regions are desired remain covered, thereafter executing gate oxidation and completing fabrication of the desired circuit.

9 Claims, 4 Drawing Figures

METHOD OF PRODUCING LOW-RESISTANCE DIFFUSED REGIONS IN IC MOS SEMICONDUCTOR CIRCUITS IN SILICON-GATE TECHNOLOGY METAL SILICIDE LAYER FORMATION

BACKGROUND OF THE INVENTION

1. Field of the Invention

The invention relates to production of low-resistance diffused regions and somewhat more particularly to a process of producing low-resistance diffused regions useful as current-supply paths in IC MOS semiconductor circuits in silicon-gate technology whereby the sheet resistance of such regions is reduced via formation of a metal silicide surface.

2. Prior Art

In complicated MOS circuits, for example, in dynamic RAM (random-access-memory) circuits, the diffused regions which arise during source-drain doping are frequently used as current-supply paths. The sheet resistance of such diffused regions presently has a lower limit of about 15 $\Omega/\square$, in instances of relatively shallow dopant penetration depth, for example about 0.5 $\mu$m. However, in certain circuits, this value is too high and in such instances, a value of only a few $\Omega/\square$ are desired.

*Bell Systems Technical Journal*, Vol. 47, pages 195–208 (1968) suggests producing silicon-Schottky-barrier diodes with platinum silicide contacts and diffused guard rings. In this manner, the circuit speed of such diodes is raised significantly.

This platinum silicide technology is used, as set forth by C. E. Weitzel et al, Proceedings of the Electrochemical Society, Spring Meeting, pages 683–685 (May 1978), to produce platinum silicide polysilicon gate MOS transistors so as to reduce the sheet resistance of doped polycrystalline regions by approximately an order of magnitude via formation of a platinum silicide surface.

However, when attempts are made to generate such a silicide layer on a monocrystalline diffused region, problems arise in silicon-gate technology because short circuits can arise between the monocrystalline diffused regions and the polycrystalline gate electrode regions, which are spaced only about 50 nm from one another (this distance corresponds to the gate-oxide thickness).

SUMMARY OF THE INVENTION

The invention provides a method of producing low-resistance diffused regions useful as current-supply paths in IC MOS semiconductor circuits in silicon-gate technology whereby sheet resistance of such regions is reduced via formation of a metal silicide surface in such a manner that short circuits cannot occur and yet a lower resistance of such diffused regions can be obtained in a range of but a few $\Omega/\square$.

In accordance to the principles of the invention, such method is practiced by generating a metal silicide layer on a doped polysilicon layer before gate oxidation, applying a silicon oxide layer over such silicide layer, structuring the resulting SiO$_2$-silicide-polysilicon triple layer so that the diffused regions remain covered and thereafter executing gate-oxidation.

A specific exemplary embodiment of the invention comprises, a combination of the sequential steps of:

(a) depositing a polycrystalline silicon layer of a given (second) conductivity type on a monocrystalline silicon substrate of an opposing (first) conductivity type to that of the given conductivity type;

(b) depositing a layer of a metal which forms a silicide onto the polysilicon layer and converting a zone of such polysilicon layer which lies relatively close to its surface into a metal silicide layer;

(c) depositing a silicon dioxide layer onto the entire structure surface;

(d) structuring the resulting SiO$_2$-silicide-polysilicon triple layer in such a manner that the substrate areas where the diffused monocrystalline regions are desired, remain covered;

(e) producing a gate-oxide via thermal oxidation and substantially simultaneously generating said diffused regions;

(f) etching contact holes to the diffused regions;

(g) depositing an undoped polycrystalline silicon layer onto the entire structure surface;

(h) locally oxidizing the undoped polysilicon layer via a nitride mask which covers gate regions and contact holes to the diffused regions;

(i) doping the undoped polysilicon layer via a dopant of a given (second) conductivity type; and (j) generating metal paths or interconnections as required to complete the device.

In certain preferred embodiments, the doped polycrystalline silicon layer in step (a) is deposited in a thickness of about 0.2 $\mu$m.

In certain preferred embodiments, the silicide-forming metal is selected from the group consisting of platinum, tungsten, and molybdenum and such metal layer is deposited in a thickness of about 0.1 $\mu$m. The conversion of the polysilicon layer into a metal silicide layer preferably occurs in an inert atmosphere at temperatures in the range of about 600° to 800° C.

In certain preferred embodiments of the invention, the SiO$_2$-layer in step (c) is deposited at a thickness of about 0.2 to 0.5 $\mu$m and most preferably at about 0.3 $\mu$m.

In certain preferred embodiments, the gate-oxide at step (e) is produced in a thickness of about 20 to 60 nm.

In certain preferred embodiments, after etching at step (f), a dopant of the first (opposing) conductivity type is implanted for adjustment of the gate-oxide application voltage and in certain other preferred embodiments, prior to step (i) an implantation of an impurity atom selected from the group consisting of boron, phosphorous and arsenic is executed for adjustment of the application voltage of the ultimately attained transistors.

DESCRIPTION OF THE PREFERRED EMBODIMENTS

Figure 1:
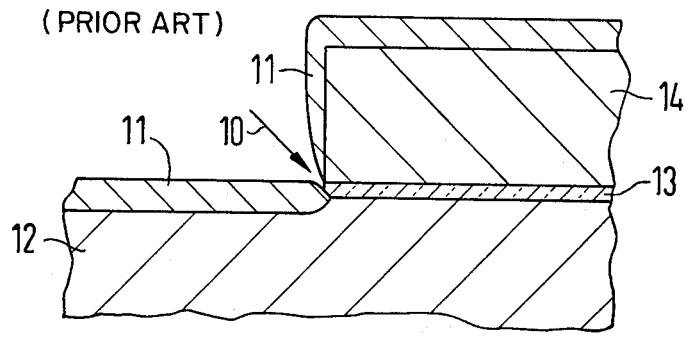
FIG. 1 is a partial, elevated, enlarged cross-sectional and somewhat schematic view of a transistor fabricated via conventional silicon-gate technology with metal silicides.

FIG. 1 illustrates a portion of a transistor produced in accordance with conventional silicon-gate technology with the use of metal silicides. As can be seen, a danger exists for a short circuit at the area indicated with arrow 10. This short circuit occurs between the monocrystalline silicon region 12 and the polysilicon layer 14 which is deposited on the gate oxide 13 via the metal silicide layer 11.

In order to avoid this danger of short circuit, a n-channel-MOS fabrication process is undertaken in accordance with the principles of the invention which is characterized by only four masking steps.

Figure 2:
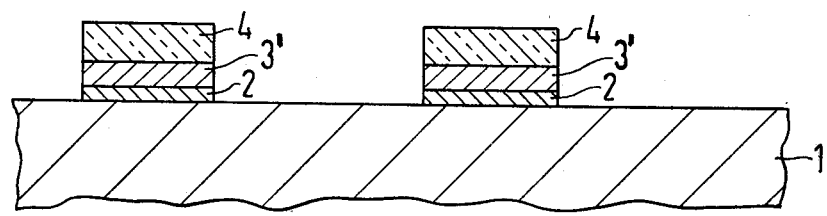
FIGS. 2–4 are somewhat similar view of a device undergoing fabrication in accordance with the principles of the invention.
Figure 3:
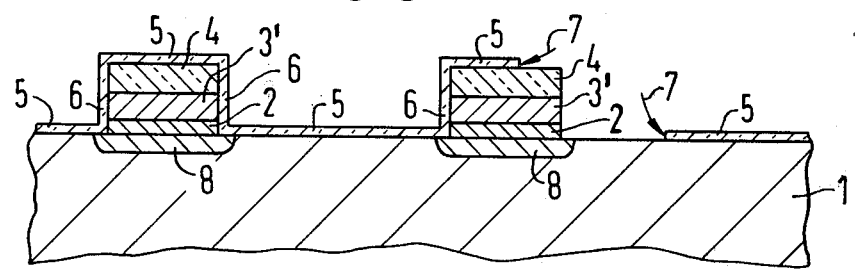

Referring now to FIG. 2, a p-doped monocrystalline silicon substrate 1 is provided on its entire active (upper) surface with a n-doped polycrystalline layer 2, having a thickness of about 0.2 μm and a specific resistance of about 200 Ω/□ via the CVD technique (chemical vapor deposition). Next, a metal layer composed of a silicide-forming metal, preferably selected from a group consisting of platinum, tungsten and molybdenum, is deposited via vapor deposition or sputtering at a thickness of about 0.1 μm. Thereafter, the metal layer is converted into a metal silicide layer 3' by annealing in an inert atmosphere at a temperature in the range of about 600° to 800° C. The metal silicide layer 3' exhibits a layer resistance of but a few Ω/□. During this annealing process, approximately 0.1 μm of the 0.2 μm thick polysilicon layer 2 is converted at its surface zone into the silicide layer 3'. Next, an approximately 0.3 μm thick SiO$_2$ layer is deposited over the entire structure surface via a CVD technique. The resultant layer sequence (SiO$_2$ layer 4-silicide layer 3' and polysilicon layer 2) is then structured via an etch-mask (first mask) in such a manner that the triple layer structure is maintained at regions where monocrystalline diffused regions 8 (best seen at FIGS. 3 and 4) are desired.

Thereafter, the structured device shown at FIG. 2 is subjected to a thermal oxidation for gate-oxide formation so that a gate-oxide layer 5 is generated having a thickness in the range of about 20 to 60 nm. Substantially simultaneously with the gate-oxide formation, a SiO$_2$ layer 6 grows on the side of the polysilicon layer 2 and the sides of the silicide layer 3'. Further, during this step, n-doped diffused regions 8 are generated. A photosensitive resist mask (second mask) is then applied and developed in a conventional manner to define windows over the gate-oxide at areas thereof where contacts are required to the diffused regions 8. Such contact holes are then etched into the gate-oxide 5 in such a manner that a portion of the contact hole surface (ie., hole periphery), edges of which are indicated by arrows 7, projects over the corresponding diffused regions 8 without having to completely etch through the SiO$_2$ layer 4 which is approximately 0.3 μm thick at such locations.

Figure 4:
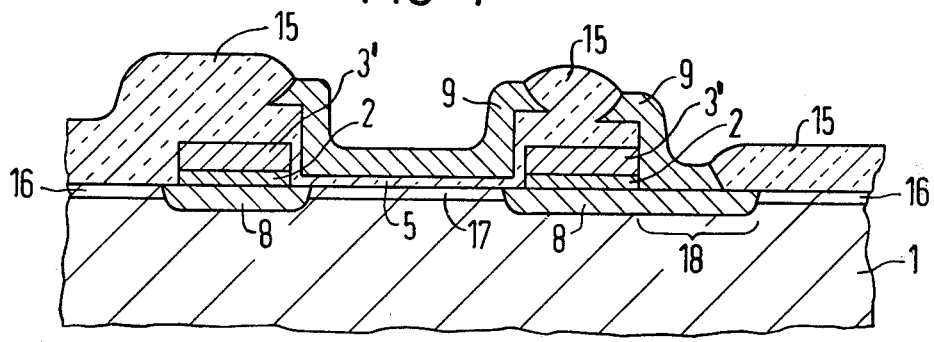

Next, as shown at FIG. 4, an undoped polysilicon layer 9 is deposited onto the entire device surface in a thickness of about 0.1 μm to 0.5 μm and is locally oxidized via a silicon nitride mask (third mask-not shown) so that the polysilicon layer 9 remains at or covers the location of the gate region 5 and the contact holes 7 to the low resistance n+-diffused regions 8. At the other locations, the polysilicon layer 9 is converted in its entire thickness into a SiO$_2$ layer 15.

After nitride etching, that is before removal of the third mask, if desired or necessary, a dopant of the first or opposing conductivity type, for example boron, can be implanted via conventional techniques for adjustment of the field oxide application voltage whereby silozones 16 are generated in substrate 1.

Optionally, the threshold voltage of the ultimately produced transistors can be adjusted by implanting a suitable dose of impurity atoms, preferably selected from the group consisting of boron, phosphorous and arsenic, so as to generate a channel zone 17 beneath the gate-oxide 5.

Thereafter, doping of the undoped polysilicon layer 9 occurs with phosphorous or arsenic so that zone 18 of the n+-diffused regions 8 is generated. It will be noted that zone 18 is positioned beneath the contact hole 7.

In instances where metal paths or interconnections are generated (via a fourth mask) it is not necessary to completely cover the polysilicon island 9 with metal. The generation of metal paths is not illustrated for sake of clarity.

As is apparent from the foregoing specification, the present invention is susceptible of being embodied with various alterations and modifications which may differ particularly from those that have been described in the preceeding specification and description. For this reason, it is to be fully understood that all of the foregoing is intended to be merely illustrative and is not to be construed or interpreted as being restrictive or limiting of the present invention, accepting as it is set forth in the hereto-appended claims.

I claim as my invention:

1. A method of producing relatively low-resistance diffused regions useful as current-supply paths in integrated MOS semiconductor circuits in silicon-gate technology wherein sheet resistance of such regions is reduced by formation of a metal silicide layer comprising, in combination, the sequential steps:
   (a) depositing a doped polysilicon layer of a given conductivity type on a monocrystalline silicon substrate of a conductivity type opposite to that of said given conductivity type;
   (b) depositing a layer of a metal which forms a silicide onto said polysilicon layer and converting a zone of such polycrystalline layer which lies relatively close to its surface into a metal silicide layer;
   (c) depositing a silicon dioxide layer onto the entire structure surface;
   (d) structuring the resultant SiO$_2$-metal silicide-polycrystalline silicon triple layer in such a manner that regions of said monocrystalline substrate which are to form the low-resistance diffused regions remain covered;
   (e) producing a gate oxide via thermal oxidation and substantially simultaneously generating said low-resistance diffused regions in said monocrystalline substrate;
   (f) etching contact holes to said diffused regions of said monocrystalline substrate;
   (g) depositing a layer of undoped polysilicon on the entire structure surface;
   (h) locally oxidizing said undoped polysilicon layer via a nitride mask which covers gate regions and contact holes to said low-resistivity diffused regions;
   (i) doping said undoped polysilicon layer with a dopant of said given conductivity type; and
   (j) generating metal paths for completion of said circuit.

2. A method as defined in claim 1 wherein said doped polycrystalline silicon layer is deposited in a layer thickness of about 0.2 μm.

3. A method as defined in claim 1 wherein said silicide-forming metal is selected from the group consisting of platinum, tungsten and molybdenum and said metal layer is deposited in a thickness of about 0.1 μm.

4. A method as defined in claim 3 wherein said metal layer is converted into a metal silicide layer in an inert gas atmosphere at temperatures in the range of about 600° C. to 800° C.

5. A method as defined in claim 1 wherein said SiO$_2$-layer is deposited in a layer thickness of about 0.2 to 0.5 μm.

6. A method as defined in claim 5 wherein said SiO$_2$ layer is deposited in a layer thickness of about 0.3 μm.

7. A method as defined in claim 1 wherein said gate-oxide is produced in a thickness in the range of about 20 to 60 nm.

8. A method as defined in claim 1 wherein after etching in step (f), a dopant of said opposing conductivity type is implanted for adjustment of gate oxide application voltage.

9. A method as defined in claim 1 wherein, prior to step (i) an impurity atom selected from the group consisting of boron, phorphorous and arsenic is implanted for adjustment of application voltage of the ultimately attained transistors.

* * * * *